(12) United States Patent
Li

(10) Patent No.: US 8,883,311 B2
(45) Date of Patent: Nov. 11, 2014

(54) LIQUID CRYSTAL DISPLAY PANEL AND CONDUCTIVE ADHESIVE, CONDUCTIVE PARTICLES AND METHOD OF MANUFACTURING THEREOF

(71) Applicant: Beijing BOE Optoelectronics Technology Co., Ltd., Beijing (CN)

(72) Inventor: Yuhua Li, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 9 days.

(21) Appl. No.: 13/633,918

(22) Filed: Oct. 3, 2012

(65) Prior Publication Data

US 2013/0026423 A1    Jan. 31, 2013

Related U.S. Application Data

(62) Division of application No. 12/109,898, filed on Apr. 25, 2008, now Pat. No. 8,293,365.

(30) Foreign Application Priority Data

Jun. 8, 2007    (CN) .......................... 2007 1 0100341

(51) Int. Cl.
*B32B 5/16*    (2006.01)
(52) U.S. Cl.
USPC ........ 428/403; 428/407; 427/212; 427/407.3; 427/485; 156/325; 156/327

(58) Field of Classification Search
USPC ............... 428/403, 407; 427/212, 485, 407.3; 156/325, 327
See application file for complete search history.

(56) References Cited

U.S. PATENT DOCUMENTS

| 7,588,826 | B2 * | 9/2009 | Zaghib et al. | 428/403 |
| 8,017,228 | B2 * | 9/2011 | Drzal et al. | 428/297.4 |
| 8,293,365 | B2 * | 10/2012 | Li | 428/403 |
| 2009/0311436 | A1 * | 12/2009 | Drzal et al. | 427/485 |
| 2011/0122596 | A1 * | 5/2011 | Miyazaki et al. | 361/818 |
| 2011/0151235 | A1 * | 6/2011 | Arai et al. | 428/297.4 |

OTHER PUBLICATIONS

Official Action for U.S. Appl. No. 12/109,898, mailed Jun. 22, 2011 6 pages Restriction Requirement.
Official Action for U.S. Appl. No. 12/109,898, mailed Oct. 14, 2011 5 pages.
Official Action for U.S. Appl. No. 12/109,898, mailed Mar. 12, 2012 4 pages.
Notice of Allowance for U.S. Appl. No. 12/109,898, mailed Jun. 22, 2012 7 pages.

* cited by examiner

*Primary Examiner* — Leszek Kiliman
(74) *Attorney, Agent, or Firm* — Ladas & Parry LLP

(57) ABSTRACT

The present invention relates to a conductive particle, a conductive adhesive with the conductive particles, a LCD panel with the conductive adhesive, a method of manufacturing of the conductive particle and a method of manufacturing of the conductive adhesive. The conductive particle comprising an outer coating layer of graphite and an inner core of an organic resin enclosed by the outer coating layer, and therefore the conductive particles can have good conductivity as well as good strength and elasticity.

12 Claims, 3 Drawing Sheets

LIQUID CRYSTAL DISPLAY PANEL AND CONDUCTIVE ADHESIVE, CONDUCTIVE PARTICLES AND METHOD OF MANUFACTURING THEREOF

RELATED APPLICATIONS

This application is a divisional of U.S. patent application Ser. No. 12/109,898 filed on Apr. 25, 2008. The entire disclosure of the prior application is considered to be part of the disclosure of the accompanying application and is hereby incorporated by reference.

FIELD OF THE INVENTION

The present invention relates to a liquid crystal display panel and a conductive adhesive, a conductive particle, a method of manufacturing of a conductive particle and a method of manufacturing of a conductive adhesive.

BACKGROUND OF THE INVENTION

A liquid crystal display (LCD) has been developed aggressively in recent years and more and more LCDs with good quality are available on the market. In a conventional process of manufacturing a LCD panel with a color filter substrate and an array substrate, a seal adhesive and a conductive adhesive are normally separately applied thereon. As shown in FIG. 1, a seal adhesive 2 used only for adhering to an array substrate and a conductive adhesive 3 used only for connecting a conductive electrode are applied separately on a color filter substrate 1. A pixel region 4 is shown to represent the entire pixel region of LCD.

An assembling process is performed following the application of the seal adhesive 2. Since there are no other supports provided outside the pixel region 4, and there is no conductive particles within the seal adhesive 2, an excess deformation may occur to a portion of the seal adhesive during the assembling process due to strong electrostatic adherence and atmospheric pressure, so that the cell thickness of the LCD panel may not be uniform after the photo curing and/or thermal curing of the seal adhesive, which in turn results in a display problem in peripheral regions of LCD, such as a phenomenon referred as side mura, which can drastically reduce the display quality of the LCD panel.

In a conventional LCD design, application region for the conductive adhesive 3 and that for the seal adhesive 2 are very close to each other, so that if an excess amount of conductive adhesive 3 is applied, there is an overlapping region between the conductive adhesive 3 and the seal adhesive 2 where the cell thickness is greater than that of other regions. This can also result in a side mura phenomena. Moreover, since there may be a large discrepancy between a desired position and an actual position where the conductive adhesive 3 is applied, the resultant poor contact between the conductive adhesive 3 and electrodes can lower the conductivity and drastically reduce the display quality of the LCD panel.

Therefore, separation of the seal adhesive and the conductive adhesive in a conventional LCD display may give rise to problem of side mura due to non-uniformity of cell thickness and problem of poor display quality due to the poor conductivity caused by the deflection from the desired applying position of the conductive adhesive.

SUMMARY OF THE INVENTION

According to the present invention, there is provided a conductive particle, a conductive adhesive with the conductive particle, and a LCD panel using the conductive adhesive and a method of manufacturing of the conductive particle and a method of manufacturing of the conductive adhesive. The conductive particle has good conductivity as well as good strength and elasticity.

According to one embodiment of the present invention, there is provided a conductive particle comprising an outer coating layer of graphite and an inner core of an organic resin enclosed by the outer coating layer of graphite.

The conductive particle according to the embodiment of the present invention has a composite structure of the inner core of the organic resin and the outer coating of graphite, and therefore the conductive particles can have good conductivity as well as good strength and elasticity.

According to another embodiment of the present invention, there is provided a conductive adhesive comprising a seal adhesive and a plurality of conductive particles dispersed in the seal adhesive and each conductive particle comprises an outer coating layer of graphite and an inner core of an organic resin enclosed by the outer coating layer of graphite.

The conductive adhesive according to the embodiment of the present invention can provide both adhesion and conductivity, and furthermore, the conductive adhesive can provide support since the conductive particles dispersed therein has good strength and elasticity.

According to yet another embodiment of the present invention, there is provided a LCD panel comprising a color filter substrate and an array substrate opposing and bonding to each other using a conductive adhesive. The conductive adhesive comprises a seal adhesive and a plurality of conductive particles dispersed in the seal adhesive and each conductive particle comprises an outer coating layer of graphite and an inner core of an organic resin enclosed by the outer coating layer of graphite.

Since the conductive particle having good strength and elasticity is added to the seal adhesive for bonding the color filter substrate and the array substrate together, the conductive particle can provide both conductivity and adhesion during the assembling in use of the conductive adhesive. Furthermore, since the cell thickness of the LCD panel can be well controlled due to the good elasticity of the conductive particle so that the LCD panel according to the embodiment of the present invention can have a uniform cell thickness and avoid side mura effect. Furthermore, since the conductive adhesive can provide both adhesion and conductivity, the poor conduction due to the deflection from the desired applying position of the conductive adhesive when the conductive adhesive and the seal adhesive are separated can be prevented so as to improve the display quality of the LCD panel.

According to yet another embodiment of the present invention, there is provided a method of manufacturing of a conductive particle comprising an outer coating layer of graphite and an inner core of an organic resin enclosed by the outer coating layer of graphite. The method comprises a step of disposing graphite particles and organic resin particles coated with a catalyst and a surfactant in a reactor to react with each other and a step of separating the conductive particle from a mixture resulted from the reaction.

The conductive particle obtained by the method of manufacturing according to the embodiment of the present invention can provide good conductivity as well as good strength and elasticity.

According to yet another embodiment of the present invention, there is provided a method of manufacturing of a conductive adhesive. The method comprises a step of mixing a seal adhesive, a glass fiber and a plurality of conductive particles, each of which comprises an outer coating layer of graphite and an inner core of an organic resin enclosed by the outer coating layer of graphite and a step of debubbling the mixture of the seal adhesive, the glass fiber and the conductive particles.

The conductive adhesive obtained by the method of manufacturing according to the embodiment of the present invention can provide both good adhesion and conductivity. Furthermore, the conductive adhesive can provide support since the conductive particles dispersed therein has good strength and elasticity.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

The present invention will be described in further details with reference to the accompanying drawings and embodiments thereafter.

Figure 1:
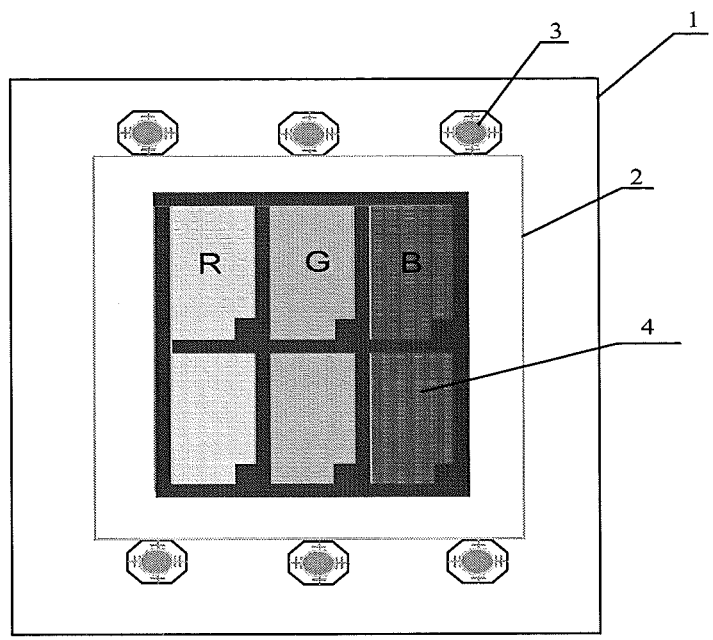
FIG. 1 is schematic views showing a structure of a conventional color filter substrate after applying a seal adhesive and a conductive adhesive.
Figure 2:
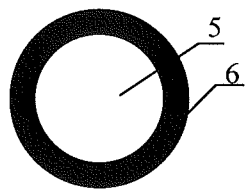
FIG. 2 is a schematic cross-sectional view of a conductive particle according to the present invention.

According to an embodiment of the present invention, there is provided a conductive particle in a spherical shape or another shape. A plurality of conductive particles can be mixed into a seal adhesive usable in a LCD. The size of the conductive particles may range from about 100 nm to about 9000 nm, such as 3000 nm, 4000 nm, or 5000 nm. The conductive particles comprise an outer coating layer of graphite and an inner core of an organic resin enclosed by the outer coating layer of graphite. The organic resin of the inner core can be phenolic resin, polyurethane resin, or the like. The graphite of the outer coating layer can be a conductive material selected from natural graphite, nodular graphite, and artificial graphite. The organic resin can serve as the inner core of the conductive particle with a size ranging from 10 nm to 1000 nm. As shown in FIG. 2, which is a cross-sectional view of the conductive particle, the inner core of the conductive particle is an organic resin particle 5 coated by an outer coating layer 6 of graphite. The organic resin particle 5 has good strength and elasticity, while the thickness of the graphite outer coating layer 6 can be adjusted as necessary.

The conductive particles according to the present embodiment has a composite structure of the inner core of the organic resin and the outer coating of graphite, and therefore the conductive particles can provide good conductivity as well as good strength and elasticity.

Figure 3:
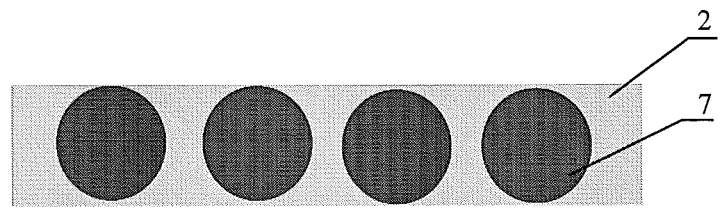
FIG. 3 is a schematic view showing the internal structure of a conductive adhesive according to the present invention.

According to another embodiment of the present invention, there is provided a conductive adhesive. As shown in FIG. 3, which is a schematic view showing an internal structure of the conductive adhesive, the conductive adhesive comprises a seal adhesive 2 and a plurality of conductive particles 7 dispersed in the seal adhesive 2, and each conductive particle 7 comprises an outer coating layer of graphite and an inner core of an organic resin enclosed by the outer coating layer of graphite. The conductive particle 7 can be the conductive particle with an inner core of an organic resin and an outer coating layer of graphite as described above, and a plurality of particles can be dispersed in the seal adhesive uniformly, or can be dispersed non-uniformly. An appropriate amount of glass fiber may be preferably added to the conductive adhesive to provide a better strength.

The conductive adhesive according to the present embodiment of the invention comprises the conductive particles with an inner core of the organic resin and an outer coating layer of graphite. Thus, the conductive adhesive can provide both adhesion and conductivity. The conductive graphite offers conductivity. When an upper substrate and a low substrate are assembled together by the adhesive under the atmospheric pressure, the upper and the lower substrates are tightly bonded to each other so that the conductive particles dispersed in the adhesive are compressed. Due to the good elasticity of the conductive particles, such compressed particles closely contact with the upper and the lower substrates so as to ensure the good conductivity between common electrodes on the upper and the lower substrates with the good conductivity of the graphite of the outer coating layer. The specific mass ratio of the conductive graphite outer coating layer to the organic resin inner core in the conductive particles can be adjusted as necessary. Generally, such adjustment depends on the size ratio of the conductive particle to the inner organic resin particle, for example, the radius ratio of conductive particle comprising the inner core of the organic resin and the out coating layer of graphite to the inner organic resin core may be about 1:1 to 10:1. The inner core of the organic resin can provide good strength and elasticity for the conductive particle. Furthermore, the conductive adhesive can preferably provide better strength and elasticity if the glass fibers are mixed therein.

Figure 4:
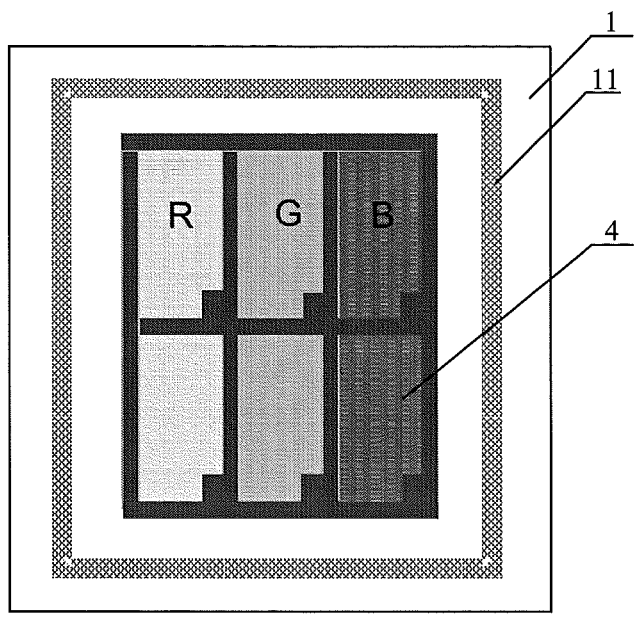
FIG. 4 is a schematic view showing a color filter substrate of a LCD panel according to the present invention.
Figure 5:
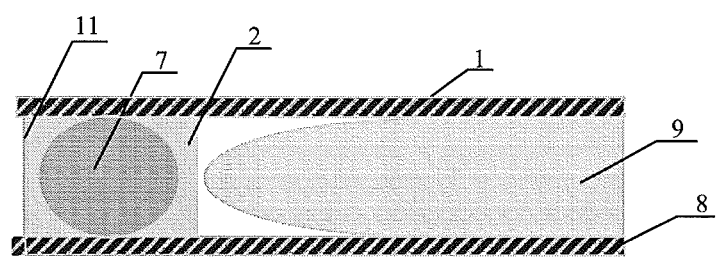
FIG. 5 is a partial cross-sectional view showing a LCD panel according to the present invention.

According to yet another embodiment of the present invention, there is provided a LCD panel comprising a color filter substrate and an array substrate opposing to each other. A plurality of pixels defined by gate lines and signal lines and respective switching elements for the pixels are formed on the array substrate, while color filters such as red (R), green (G) and blue (B) color filters corresponding to respective pixels are formed on the color filter substrate. A liquid crystal material is filled in the space between the color filter substrate and the array substrate. FIG. 4 is a schematic view showing the color filter substrate in the LCD panel. As shown in FIG. 4, a conductive adhesive 11 is applied along the peripheral of a pixel region 4 on a color filter substrate 1. In FIG. 4, only six exemplary pixels arranged in a matrix of 2 by 3 with R, G and B pixels in each row are shown in the pixel region 4 which schematically represents the entire pixel region. The present invention is not limited to the above configuration. FIG. 5 shows a partial schematic cross-sectional view of the LCD panel. The color filter substrate 1 and the array substrate 8 are bonded to each other by the conductive adhesive 11, and the liquid crystal 9 is filled in the space between the color filter substrate 1 and the array substrate 8. The conductive adhesive 11 is the conductive adhesive according to the above embodiment of the present invention.

Generally, the cell thickness of the LCD panel ranges from about 500 nm to about 6000 nm. In order to ensure good conductivity between the upper and the lower substrates, the size of the conductive particle is larger than the actual cell thickness. Therefore, the conductive particles will be deformed under the atmospheric pressure; however, such deformation should not be excessive. For example, the cell thickness of the LCD panel is about 4000 nm, and the size of the conductive particle preferably ranges from about 4200 nm to about 5200 nm, that is, the deformation of conductive particle preferably ranges from about 5% to 30%. The conductive particle 7 comprises the inner core of an organic resin and the outer coating of the graphite, which encloses the inner organic resin core, and therefore the conductive particle 7 has good strength and elasticity. The thickness of the outer coating layer of graphite can be adjusted as necessary. The conductive particle 7 can be uniformly dispersed in the seal adhesive.

Since the conductive particle having good strength and elasticity is added to the seal adhesive that is used to bond the color filter substrate and the array substrate, the conductive adhesive can provide both conductivity and adhesion in the assembling process. Furthermore, since the cell thickness of the LCD panel can be well controlled by the elasticity of the conductive particle, the LCD panel according to the embodiment of the present invention can have a uniform cell thickness and avoid the side mura phenomena. Furthermore, since the conductive adhesive can provide both adhesion and conductivity, the poor conduction due to the deflection from the desired applying position of the conductive adhesive when the conductive adhesive and the seal adhesive are separately applied can be prevented so as to improve the display quality of the LCD panel.

Figure 6:
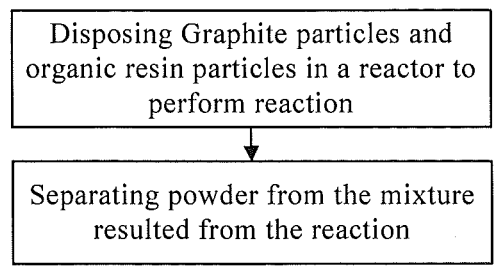
FIG. 6 is a flow chart showing a method of manufacturing of a conductive particle according to the present invention.

According to yet another embodiment of the present invention, there is provided a method of manufacturing of a conductive particle. FIG. 6 is a flow chart showing a method of manufacturing of a conductive particle according to the present invention. The method may mainly comprise the following steps.

An organic resin particle with a certain strength and elasticity can be selected as a base particle. A catalyst and a surfactant can be applied on the surface of the base particle. The catalyst and the surfactant can be selected according to specific requirements. For example, the catalyst and the surfactant may be porous silicon and the like. The applying process can be performed by a ball milling method, for example, which will be described thereafter. In the method, a solution with a desired catalyst and a desired surfactant is mixed with the organic resin in a sealed container made of glass or metal with stirrers disposed therein. The above container is then placed on a ball milling machine. The thickness of the catalyst and the surfactant can be adjusted in a range of 1 nm to 100 nm by controlling reaction conditions in the container (for example, a reaction temperature ranging from about −10° C. to 200° C., a reaction time ranging from about 0.1 h to 100 h, a rotation speed of the stirrer ranging from about 10 rpm to 1000 rpm, and a solution with a pH value of about 4-8, a coefficient of viscosity of about 0.001 μPa·s to 20 Pa·s, and a concentration of about 0.7-10 g/l) and the rotation speed of the ball milling machine. After the desired thickness of the catalyst and the surfactant is obtained, the particles are taken out of the container and then dried. For example, the stirrers can be grinding balls such as hard alloy balls, the reactor made of glass and metal can be a ball milling jar such as hard alloy jar, and the ball milling machine can be a planetary type ball milling machine.

Then, graphite particles and the organic resin particles coated with the catalyst and the surfactant according to the above method are disposed into a container made of glass or metal with stirrers disposed therein. Then the above container is placed on a ball milling machine to prepare the conductive particles by a ball milling method. The reaction condition can be adjusted depending on specific requirements; for example, for the reaction condition, the reaction temperature ranges from about −10° C. to about 200° C., the reaction time ranges from about 0.1 h to about 100 h, the degree of vacuum in the reaction ranges from $10^{-6}$ Pa to $10^4$ Pa, the rotation speed of the stirrer ranges from about 10 rpm to about 1000 rpm, and the solution has a pH value of about 4-8, a coefficient of viscosity of about 0.001 μPa·s to 20 Pa·s, and a concentration of about 0.7-10 g/l. Similarly, the stirrers can be grinding balls such as hard alloy balls, the container made of glass and metal can be a ball milling jar such as hard alloy jars, and the ball milling machine can be a planetary type ball milling machine, for example. The conductive particles can be obtained by separating the reaction products following the ball milling process and be classified by controlling specific condition and parameters in the powder separation process for example by sieving.

The organic resin particle used for preparing the conductive particle with the above method according to the above embodiment has a size of about 10-1000 nm, while the conductive particle prepared with the method according to the above embodiment has a size of about 100-9000 nm. According to the above method, the graphite is coated on the surface of the organic resin particle serving as the inner core, thus the size of the conductive particle can be controlled by adjusting the thickness of the graphite coating layer, which in turn depends on the above reaction conditions.

The graphite particles applicable in the above method can be obtained by the ball milling method as well, for example. Firstly, the graphite material and the hard alloy balls are mixed together in a certain ratio (about 1:10-10:1, for example). A dispersant can also be added into the mixture with a volume ratio ranging from about 1:10 to 10:1 with respect to the mixture. The dispersant may comprise distilled water, ethanol, propanol or the like. The mixture and the dispersant can be disposed into a hard alloy ball milling jar, which is then sealed and placed on a ball milling machine such as a planetary type ball milling machine and rotated for several hours in a certain speed so as to perform ball milling. The rotation speed of the ball milling machine can be adjusted according to specific requirements, for example, in a range of about 100 rpm to about 30000 rpm. The size of graphite particle thus obtained ranges from about 100 nm to about 9000 nm, for example, 3000 nm, 4000 nm, or 5000 nm.

According to the method of manufacturing of the conductive particles of the present embodiment, a particle with a composite structure of an inner core of an organic resin and an outer coating layer of conductive graphite can be obtained. The particle can provide both good conductivity and good strength and elasticity.

Figure 7:
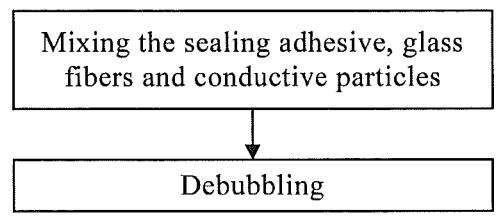
FIG. 7 is a flow chart showing a method of manufacturing of a conductive adhesive according to the present the invention.

According to yet another embodiment of the present invention, there is provided a method of manufacturing of a conductive adhesive. The method may be a ball milling method, for example. FIG. 7 is a flow chart showing a method of manufacturing of a conductive adhesive according to the present the invention with the following main steps.

Firstly, a certain amount of a seal adhesive is added into a container, such as a mixer, a spherical shaped milling container etc. The amount of the seal adhesive depends on the volume of the container and the specific requirements. The seal adhesive can be of any type in the art, including a thermal curing or a photo curing resin, for example, amines, carboxylic acid, acid anhydride, epoxy resin, phenol resin or the like. Then a glass fiber is added into the mixture in a mass ratio ranging from about 1:1000 to about 10:1 with respect to the seal adhesive, for example. Next, a plurality of conductive particles each having a composite structure of an inner core of an organic resin and an outer coating layer of graphite obtained according to the above method are added into the mixture in a mass ratio ranging from about 1:1000 to about 10:1 with respect to the seal adhesive. The above components are mixed together adequately so as to form a homogeneous mixture.

Then the above mixture is disposed into a debubbling container placed on a planetary type ball milling machine. The particles within the container are subjected to a convection flow by a centrifugal force due to rotation and revolution of the container on the planetary type ball milling machine. Since the mixture is stirred by the convection flow in a vacuum condition in the container, the bubbles at the bottom of the container gradually ascends to the vacuum layer at the top where the bubbles expand and then burst so as to achieve a so-called debubbling effect. The debubbling effect can be estimated by observing the surface of the conductive adhesive while stopping the rotation and revolution of the container. If there are no bubbles appeared on the surface, there would be no bubbles within the conductive adhesive. The conductive adhesive is ready to be used after resting for a few hours following the debubbling.

The conductive adhesive obtained by the method of manufacturing according to the embodiment of the present invention can provide both adhesion and conductivity. Furthermore, the conductive adhesive can provide support since the conductive particles dispersed therein has good strength and elasticity.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A method of manufacturing of a conductive particle comprising an outer coating layer of graphite and an inner core of an organic resin enclosed by the outer coating layer of graphite, the method comprises the steps of:
    coating a catalyst and a surfactant on organic resin particles;
    disposing graphite particles and organic resin particles coated with the catalyst and the surfactant in a reactor to react with each other; and
    separating the conductive particle from a mixture resulted from the reaction,
    wherein the organic resin has elasticity and a size of the conductive particle ranges from about 100 nm to about 9000 nm.

2. The method according to claim 1, wherein the step of disposing graphite particles and organic resin particles coated with a catalyst and a surfactant in a reactor to react with each other further comprises the steps of:
    disposing graphite and grinding balls in to a ball milling jars and then sealing the ball milling jar; and
    placing the ball milling jar on a ball milling machine to perform ball milling so as to obtain the graphite particles.

3. The method according to claim 2, further comprising a step of adding a dispersant into the ball milling jar prior to the step of disposing graphite particles and organic resin particles coated with a catalyst and a surfactant in a reactor to react with each other.

4. The method according to claim 3, wherein a thickness of the outer coating layer of graphite is adjusted by controlling reaction conditions in the reactor.

5. A method of manufacturing of a conductive adhesive comprising steps of:
    mixing a seal adhesive, glass fibers, and conductive particles, each of the conductive particles comprising an outer coating layer of graphite and an inner core of an organic resin enclosed by the outer coating layer of graphite; and
    debubbling the mixture of the seal adhesive, the glass fibers, and the conductive particles,
    wherein prior to the step mixing the seal adhesive, the glass fibers and the conductive particles, the method further comprises step of:
    coating a catalyst and a surfactant on organic resin particles;
    disposing graphic particles and organic resin particles coated with the catalyst and the surfactant in a reactor to react with each other and
    separating the conductive particles from a mixture -resulted from the reaction,
    wherein the organic resin having elasticity and a size of the conductive particle ranges from about 100 nm to about 9000 nm.

6. The method according to claim 5, the step of disposing graphite particles and organic resin particles coated with a catalyst and a surfactant in a reactor to react with each other comprises the steps of:
    disposing graphite and grinding balls in to a ball miffing jars and then sealing the ball milling jar; and
    placing the ball miffing jar on a ball miffing machine to perform ball milling so as to obtain the graphite particles.

7. The method according to claim 6, further comprising a step of adding a dispersant into the ball milling jar prior to the step of sealing the ball milling jar.

8. The method according to claim 7, wherein a thickness of the outer coating layer of graphite is adjusted by controlling reaction conditions in the reactor.

9. The method according to claim 1, wherein the organic resin particles coated with a catalyst and a surfactant are obtained by a ball milling method.

10. The method according to claim 1, wherein a thickness of the catalyst and the surfactant coated on the organic resin particles is in a range of 1 nm to 100 nm.

11. The method according to claim 5, wherein the organic resin particles coated with a catalyst and a surfactant are obtained by a ball milling method.

12. The method according to claim 5, wherein a thickness of the catalyst and the surfactant coated on the organic resin particles is in a range of 1 nm to 100 nm.

* * * * *